United States Patent
Heo et al.

(10) Patent No.: US 11,613,651 B2
(45) Date of Patent: Mar. 28, 2023

(54) HIGH HEAT-RESISTANT COMPOSITION AND METHOD OF MANUFACTURING THREE-DIMENSIONAL SUBSTRATE USING THE SAME

(71) Applicants: Samsung Display Co., Ltd., Yongin-si (KR); KCC CORPORATION, Seoul (KR)

(72) Inventors: Jin Nyoung Heo, Yongin-si (KR); Hyuck Kang, Seongnam-si (KR); Dae Hwan Kim, Yongin-si (KR); Jeong Su Oh, Seoul (KR); Jong Kap Jo, Yongin-si (KR); Yu Sik Jeon, Yongin-si (KR); Jae Seung Jeon, Yongin-si (KR)

(73) Assignees: SAMSUNG DISPLAY CO., LTD., Gyeonggi-Do (KR); KCC CORPORATION, Seoul (KR)

( * ) Notice: Subject to any disclaimer, the term of this patent is extended or adjusted under 35 U.S.C. 154(b) by 938 days.

(21) Appl. No.: 16/425,120

(22) Filed: May 29, 2019

(65) Prior Publication Data
US 2019/0367731 A1 Dec. 5, 2019

(30) Foreign Application Priority Data

May 30, 2018 (KR) .................. 10-2018-0062070

(51) Int. Cl.
*C08L 83/04* (2006.01)
*C08K 3/013* (2018.01)
(Continued)

(52) U.S. Cl.
CPC ............ *C08L 83/04* (2013.01); *C03C 17/009* (2013.01); *C08G 63/695* (2013.01); *C08K 3/013* (2018.01);
(Continued)

(58) Field of Classification Search
None
See application file for complete search history.

(56) References Cited

U.S. PATENT DOCUMENTS 7,728,056 B2 6/2010 Kuvshinnikova et al.
8,722,835 B2 5/2014 Mowrer et al.
(Continued)

FOREIGN PATENT DOCUMENTS

CN 101208397 A 6/2008
CN 101336268 A 12/2008
(Continued)

OTHER PUBLICATIONS

Chinese Patent Office on Mar. 30, 2022 with respect to the Chinese Patent Application No. 201910461902.8 filed on May 30, 2019.
(Continued)

*Primary Examiner* — Joshua D Zimmerman
(74) *Attorney, Agent, or Firm* — Cantor Colburn LLP

(57) ABSTRACT

A heat-resistant composition including: a binder resin including at least two of a silicone-modified polyester resin, a siloxane compound, or a silanol compound; a pigment including at least two of iron cobalt chromite black spinel (ICCB), copper chromite black spinel (CCB), iron chromite manganese (ICM), or carbon black; and a catalyst.

8 Claims, 10 Drawing Sheets

(51) Int. Cl.
  *C03C 17/00* (2006.01)
  *C08G 63/695* (2006.01)
  *C08K 3/04* (2006.01)
  *C08K 3/22* (2006.01)
  *C08K 5/5419* (2006.01)
  *C09D 11/324* (2014.01)

(52) U.S. Cl.
  CPC .................. *C08K 3/04* (2013.01); *C08K 3/22* (2013.01); *C08K 5/5419* (2013.01); *C09D 11/324* (2013.01); *C03C 2217/29* (2013.01); *C03C 2217/72* (2013.01); *C03C 2217/73* (2013.01); *C03C 2217/78* (2013.01)

(56) References Cited

U.S. PATENT DOCUMENTS

| | | | |
|---|---|---|---|
| 9,862,639 | B2 | 1/2018 | Koo et al. |
| 9,994,728 | B2 | 6/2018 | Hyung et al. |
| 10,982,122 | B2 | 4/2021 | Branigan et al. |
| 2008/0096024 | A1 | 4/2008 | Cavallin |
| 2010/0189993 | A1 | 7/2010 | Mori et al. |
| 2014/0326236 | A1 | 11/2014 | Magdassi et al. |
| 2016/0208959 | A1* | 7/2016 | Davidson .................. F16L 3/00 |

FOREIGN PATENT DOCUMENTS

| | | | | |
|---|---|---|---|---|
| CN | 103403111 A | 11/2013 | | |
| CN | 105467754 A | 4/2016 | | |
| CN | 107075315 A | 8/2017 | | |
| JP | H05255638 A | 10/1993 | | |
| JP | H0822994 B2 | 3/1996 | | |
| KR | 1020150057460 A | 5/2015 | | |
| KR | 101584492 B1 | 1/2016 | | |
| KR | 2018011466 A * | 2/2018 | ........... B29C 51/145 |
| KR | 1020180011466 A | 2/2018 | | |

OTHER PUBLICATIONS

Office Action issued from the Korean Intellectual Property Office dated Aug. 21, 2020 with respect to Korean Patent Application No. 10-2018-0062070 filed on May 30, 2018.

Notice of Allowance issued from the Korean Intellectual Property Office dated Feb. 22, 2021 with respect to Korean Patent Application No. 10-2018-0062070 filed on May 30, 2018.

Extended European Search Report issued from the European Patent Office dated Aug. 21, 2019 with respect to the European Patent Application No. 19177442.1 filed on May 29, 2019.

* cited by examiner

HIGH HEAT-RESISTANT COMPOSITION AND METHOD OF MANUFACTURING THREE-DIMENSIONAL SUBSTRATE USING THE SAME

This application claims priority to Korean Patent Application No. 10-2018-0062070, filed on May 30, 2018, and all the benefits accruing therefrom under 35 U.S.C. § 119, the content of which is incorporated herein by reference in its entirety.

BACKGROUND

1. Field

A heat-resistant composition and a method of manufacturing a three-dimensional substrate including a pattern printed using the heat-resistant composition.

2. Description of the Related Art

A display unit such as a mobile phone, a digital camera, a navigation device for a transporter, a front glass unit of a vehicle, or the like, may include a pattern having a certain color for the purpose of preventing damage to the display unit and the glass unit, enlarging a display of the display unit and/or the glass unit, or decorating an edge of the display unit and/or the glass unit.

SUMMARY OF THE INVENTION

A heat-resistant composition having excellent ultrahigh heat resistance, ease of chemical strengthening, and ease of alkaline cleaning, and a method of manufacturing a three-dimensional (3D) substrate on which a pattern is printed using the heat-resistant composition are provided.

A heat-resistant composition according to an exemplary embodiment includes: a binder resin including at least two of a silicone-modified polyester resin, a siloxane compound, or a silanol compound; a pigment including at least two of iron cobalt chromite black spinel (ICCB), copper chromite black spinel (CCB), iron chromite manganese (ICM), or carbon black; and a catalyst.

In an exemplary embodiment, the siloxane compound may be a compound represented by following Formula 1:

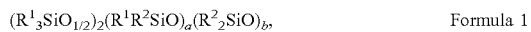

Formula 1 wherein $R^1$ is a hydrogen atom, a substituted or unsubstituted alkyl group, a $C_2$-$C_6$ alkenyl group, a $C_6$-$C_{12}$ aryl group, or a $C_1$-$C_6$ alkoxy group, $R^2$ is a hydrogen atom, a $C_1$-$C_{10}$ alkyl group, or a $C_6$-$C_{12}$ aryl group, a and b are each independently 0 or an integer of 1 to 10,000, and a+b is an integer of 5 to 10,000.

In an exemplary embodiment, the silanol compound may include at least one of trimethylsilanol or dimethylsilanol.

In an exemplary embodiment, the binder resin may include a mixture of the silicone-modified polyester resin and the siloxane compound in a weight ratio of 1:1 to 1:9.

In an exemplary embodiment, the binder resin may include a mixture of the silicone-modified polyester resin, the siloxane compound, and the silanol compound in a weight ratio of 1:1-5:0.1-3.

In an exemplary embodiment, the pigment may include a mixture in which the ICCB and the carbon black are mixed in a weight ratio of 1:1 to 9:1.

In an exemplary embodiment, the pigment may include a mixture of the CCB and the carbon black in a weight ratio of 1:1 to 9:1.

In an exemplary embodiment, the pigment may include a mixture of the ICM and the carbon black in a weight ratio of 1:1 to 9:1.

In an exemplary embodiment, the pigment may include a mixture of the ICCB and the ICM in a weight ratio of 1:1 to 9:1.

In an exemplary embodiment, the catalyst may include a chelated titanate compound.

In an exemplary embodiment, the low activity catalyst may be present in an amount of about 1 weight percent (wt %) to about 3 wt %, based on the total weight of the composition.

In an exemplary embodiment, the composition may be printed on a substrate in a thickness of about 10 micrometers (μm) to about 20 μm.

In an exemplary embodiment, the substrate may include glass, polycarbonate (PC), poly(methyl methacrylate) (PMMA), polyimide (PI), polypropylene (PP), polyethylene (PE), polyethylene terephthalate (PET), polystyrene (PS), copolyester thermoplastic elastomer (COP), or a combination thereof.

In an exemplary embodiment, the composition may be a cured product formed by heating the composition at a temperature of about 190° C. to about 220° C. for about 30 minutes to about 2 hours.

According to another exemplary embodiment, a method of manufacturing a 3D substrate including a pattern on a surface thereof, includes: (a) applying the heat-resistant composition on a surface of a planar substrate to form a surface-treated planar substrate; and (b) three-dimensionally thermoforming the surface-treated planar substrate to provide the three-dimensional substrate.

DETAILED DESCRIPTION

Figure 1:
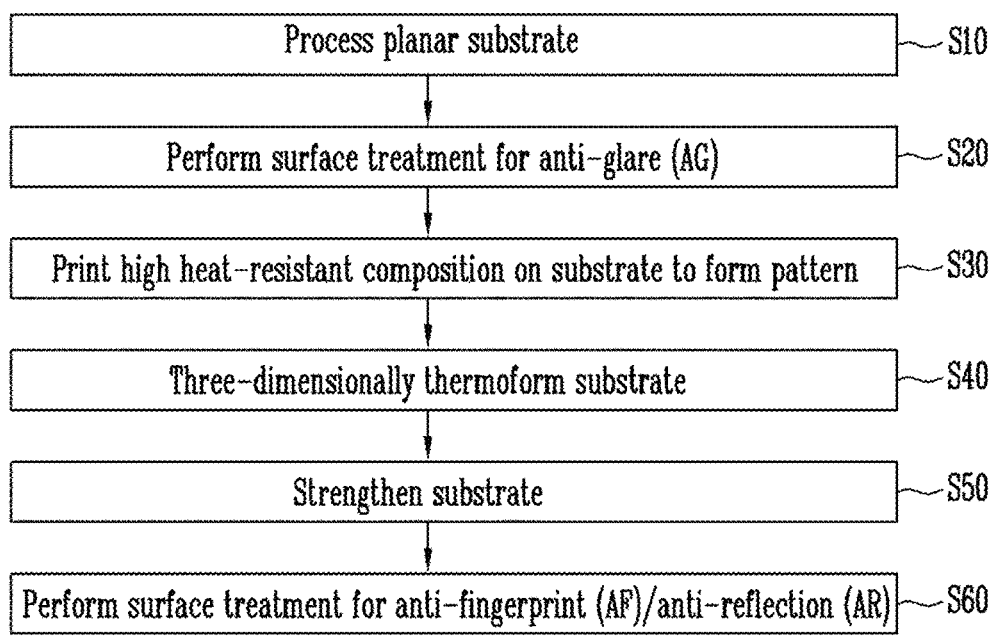
FIG. 1 is a flowchart of a method of manufacturing a three-dimensional (3D) substrate on which a pattern is printed, according to an exemplary embodiment.

The invention now will be described more fully hereinafter with reference to the accompanying drawings, in which various embodiments are shown. The invention can be modified in various different manners and may be embodied in various different forms. Specific exemplary embodiments will be described in detail with reference to the accompanying drawings. However, the present invention is not limited to the specific exemplary embodiments, but may include all modifications, equivalents and substitutions within the scope.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

As used herein, "alkyl" means a straight or branched chain, saturated, monovalent hydrocarbon group (e.g., methyl or hexyl).

As used herein, "alkenyl" means a straight or branched chain, monovalent hydrocarbon group having at least one carbon-carbon double bond (e.g., ethenyl (—HC=CH$_2$)).

As used herein, "aryl" means a monovalent group formed by the removal of one hydrogen atom from one or more rings of an arene (e.g., phenyl or naphthyl).

As used herein, "alkoxy" means an alkyl group that is linked via an oxygen (i.e., alkyl-O—), for example methoxy, ethoxy, and sec-butyloxy groups.

As used herein, "silanol" means a silicon atom that is linked via an oxygen (i.e., Si—O—).

The indicated number of carbon atoms in any of the above groups is exclusive of any substituents.

Hereinafter, exemplary embodiments will be described in more detail.

The present invention relates to a heat-resistant composition, and more particularly, to a heat-resistant composition having ultrahigh heat resistance and ease of alkaline cleaning.

A heat-resistant composition according to an exemplary embodiment comprises a binder resin including at least two of a silicone-modified polyester resin, a siloxane compound, or a silanol compound; a pigment including at least two of iron cobalt chromite black spinel (ICCB), copper chromite black spinel (CCB), iron chromite manganese (ICM), or carbon black; and a catalyst. The catalyst may be, for example, a low-activity catalyst.

The binder resin includes at least two of a silicone-modified polyester resin, a siloxane compound, or a silanol compound. For example, the binder resin may include a combination of a silicone-modified polyester resin and a siloxane compound, or may include a combination of a silicone-modified polyester resin, a siloxane compound, and a silanol compound. When a single binder resin is used, a printed layer peels off during alkaline cleaning and/or exhibits a relatively small adhesive force. However, hydrolysis is inhibited and adhesive force is improved when a combination of two or more binder resins is used.

For example, the binder resin may include a mixture of a silicone-modified polyester resin and a siloxane compound in a weight ratio of 1:1 to 1:9, for example, 1:1.5 to 1:2.4, and for example, 1:2.4. Alternatively, the binder resin may include a mixture of a silicone-modified polyester resin, a siloxane compound, and a silanol compound in a weight ratio of 1:1-5:0.1-3, for example, 1:1.7:0.7. However, a composition of the binder is not limited thereto.

The silicone-modified polyester resin is a polyester resin having an ester bond in a main chain thereof and which has been modified to include silicone. The silicone-modified polyester resin may be prepared by a condensation reaction between a silicone resin to which an alkoxy group is bonded, a polyfunctional alcohol monomer, and a polyfunctional carboxylic acid monomer.

The silicone resin to which the alkoxy group is bonded may include an alkoxy group such as a methoxy group, an ethoxy group, or a butoxy group. The silicone resin to which the alkoxy group may further include a non-functional group such as a methyl group, a propyl group, or a phenyl group in a molecule thereof.

The polyfunctional alcohol monomer may include, for example, at least one of ethylene glycol, propylene glycol, trimethylol propane, trimethylol ethane, cyclohexanedimethanol, neopentyl glycol, 2-butyl-2-ethyl-1,3-propanediol, 1,6-hexanediol, diethylene glycol, dipropylene glycol, tripropylene glycol, 1,3-butanediol, 1,4-butanediol, 1,5-pentanediol, triethylolpropane, glycerin, or pentaerythritol, but is not limited thereto.

The polyfunctional carboxylic acid monomer may include, for example, at least one of phthalic anhydride, hexahydrophthalic anhydride, methylhexahydrophthalic anhydride, tetrahydrophthalic anhydride, methyltetrahydrophthalic anhydride, succinic anhydride, an isophthalic acid, an azelaic acid, maleic anhydride, or trimellitic anhydride, but is not limited thereto.

As a compound including a siloxane bond in a molecule thereof, the siloxane compound may include, for example, at least one of polydimethylsiloxane, methyl hydrogen polysiloxane, hexamethyl polysiloxane, or methyl phenyl polysiloxane, but is not limited thereto.

The siloxane compound may include, for example, a compound represented by the following Formula 1.

$$(R^1{}_3SiO_{1/2})_2(R^1R^2SiO)_a(R^2{}_2SiO)_b \qquad \text{Formula 1}$$

In Formula 1, $R^1$ may be a hydrogen atom, a substituted or unsubstituted $C_1$-$C_{10}$ alkyl group, a $C_2$-$C_6$ alkenyl group, a $C_6$-$C_{12}$ aryl group, or a $C_1$-$C_6$ alkoxy group, and $R^2$ may be a hydrogen atom, a $C_1$-$C_{10}$ alkyl group, or a $C_6$-$C_{12}$ aryl group. The alkyl or alkenyl group may be linear or branched. The alkyl group may be, for example, a methyl group, an ethyl group, a propyl group, a butyl group, a pentyl group, a hexyl group, a cyclopentyl group, a cyclohexyl group, or the like. For example, the alkyl group may be a methyl group, an ethyl group, or a propyl group. The alkenyl group may be, for example, a vinyl group (—C=C—), a butenyl group, a pentenyl group, a hexenyl group, or the like. The aryl group may be, for example, a phenyl group, a tolyl group, a xylyl group, a naphthyl group, a biphenylene group, or the like. In addition, in Formula 1, a and b may each independently be 0 or an integer of 1 or greater, for example 1 to 10,000, and a+b may be an integer of 5 to 10,000.

The silanol compound used in the present specification may be a compound including a silanol group (≡SiOH) in a molecule thereof. For example, the silanol compound may include at least one of trimethylsilanol or dimethylsilanol, but is not limited thereto.

The binder resin may be present in an amount of about 10 wt % to about 50 wt %, or about 15 wt % to about 45 wt %, or about 20 wt % to about 40 wt %, based on the total weight of the heat-resistant composition. When a content of the binder resin is less than about 10 wt %, an adhesive force and a bonding strength of the heat-resistant composition to a substrate may be decreased. Accordingly, a printed layer may be peeled off of a substrate when exposed to a high temperature or an alkaline environment. When the amount of the binder resin exceeds 50 wt % of the total weight of the heat-resistant composition, an amount of the pigment may be relatively decreased in the composition. Accordingly, the hiding power may be lowered.

The pigment used in may include an oxide or a composite oxide of a transition metal element, such as, for example, iron (Fe), cobalt (Co), copper (Cu), chromium (Cr) or manganese (Mn). The pigment may include, for example, at least two selected of iron cobalt chromite black spinel (ICCB), copper chromite black spinel (CCB), iron chromite manganese (ICM), or carbon black.

For example, the pigment may include a combination of ICCB and carbon black, a combination of CCB and carbon black, a combination of ICM and carbon black, or a combination of ICCB and ICM. Due to the combination of the pigment compounds, it is possible to prevent chromium (Cr) in the pigment from being oxidized and to inhibit reactivity of $NO_3^-$ produced during heat strengthening, thereby preventing discoloration of the composition.

For example, the pigment may include a mixture in which ICCB and carbon black, CCB and carbon black, ICM and carbon black, or ICCB and ICM are mixed in a weight ratio of 1:1 to 9:1, for example, 2.3:1 to 9:1. Specifically, in the pigment, ICCB and carbon black may be mixed in a weight ratio of 1:1 to 9:1, for example, 2.3:1 to 4:1; CCB and carbon black may be mixed in a weight ratio of 1:1 to 9:1, or 2:1 to 9:1, or 3:1 to 9:1, for example, 9:1; ICM and carbon black may be mixed in a weight ratio of 1:1 to 9:1, or 2:1 to 9:1, or 3:1 to 9:1, or for example, 4:1 to 9:1; and ICCB and ICM may be mixed in a weight ratio of 1:1 to 9:1, or 2:1 to 9:1, or 3:1 to 9:1, for example, 4:1 to 9:1. In addition, in the pigment, ICCB, ICM, and carbon black may be mixed in a weight ratio of 1:1:0.02 to 9:1:0.1, for example, 4:1:0.05 to 9:1:0.1. However, a mixture ratio in the pigment is not limited thereto. A combination in the pigment may be adjusted according to a maximum temperature of thermoforming according to a type and a composition of a substrate.

The pigment may include a fine particle having a particle diameter of about 0.01 μm to about 20 μm, or about 0.05 μm to about 10 μm, or about 0.05 μm to about 5 μm. When a particle diameter of a heat-resistant pigment is greater than about 20 μm, compactness of a sintered thin film is degraded, and the uniformity of a printed layer may be easily decreased. In addition, when the particle diameter of the heat-resistant pigment is less than about 0.01 μm, the hiding power of the heat-resistant composition is lowered in a composition having a suitable viscosity for coating, and thus, the heat-resistant composition exhibits transparency, which is not suitable. In an embodiment, an average particle diameter of the pigment particle is about 5 μm or less, for example, about 2 μm or less, or about 1 μm or less. When the average particle diameter is 5 μm or less, a dense sintered thin film may be formed on the substrate without impairing adhesion thereto even when only a small amount of the pigment particle is added. However, the particle diameter of the pigment particle is not limited to the above range.

The pigment may be present in an amount of about 30 wt % to about 50 wt %, or about 30 wt % to about 45 wt %, or about 35 wt % to about 40 wt %, based on the total weight of the heat-resistant composition. When a content of the pigment is less than about 30 wt %, the hiding power of the heat-resistant composition may be decreased. When the content of the pigment exceeds about 50 wt %, the dispersibility of the pigment in the heat-resistant composition may be decreased, and thus, the uniformity of a printed layer may also be decreased.

The catalyst used in heat-resistant composition may be a low activity catalyst, for example, a catalyst compound having reduced catalytic activity due to the blockage of one or more reaction site in the catalyst. Specifically, the low activity catalyst may include a chelated titanate compound having two reaction sites. The chelated titanate may include, for example, a tetra($C_1$-$C_{10}$ alkoxy) titanate, such as tetra-isopropoxy titanate, tetra-methoxy titanate, tetra-octadecyloxy titanate, or diisopropyl bis(acetylacetonyl)titanate, but is not limited thereto.

The low activity catalyst may be present in an amount of about 1 wt % to about 3 wt %, or about 1 wt % to about 2.5 wt %, or about 1.5 wt % to about 2.5 wt %, based on the total weight of the composition. When a content of the low activity catalyst is less than about 1 wt % or exceeds about 3 wt %, an adhesive force between the heat-resistant composition and a substrate may be decreased.

The heat-resistant composition according an embodiment, may further include a thickener, a dispersant, a defoamer, or a combination thereof as an additive.

The thickener used in functions to increase viscosity of the heat-resistant composition, which may be decreased when components such as a binder resin, a pigment, a low activity catalyst, and a solvent are mixed. The thickener may be, for example, fumed silica, but is not limited thereto. The thickener may be further included in an amount of about 0.1 wt % to about 5 wt %, or about 1 wt % to about 5 wt %, or about 1 wt % to about 2 wt %, based on the total weight of the composition.

The dispersant is not particularly limited as long as the dispersant is capable of uniformly dispersing a pigment. For example, the dispersant may be a polymeric dispersant having a functional group, such as a polyoxyalkylene side chain or a carboxylic acid side chain, attached to a main chain, such as MALIALIM™ series (NOF Corporation) or FLOWLEN™ series (Kyoeisha Chemical Co. Ltd.). The dispersant may be further included in an amount of about 0.5 wt % to about 2 wt %, or about 0.75 to about 2 wt %, or about 1 to about 2 wt %, based on the total weight of the composition. When an amount of the dispersant is less than about 0.5 wt %, a sufficient dispersion effect may not be obtained. When the amount of the dispersant exceeds about 2 wt %, a further dispersion effect may not be obtained even when the dispersant is added in a large amount.

The defoamer functions to inhibit bubbles from being formed when viscosity of the heat-resistant composition is increased.

As a solvent, the heat-resistant composition may include butyl cellosolve (BCS), methyl isobutyl ketone (MIBK), propyl methoxy acetate (PMA), dibutyl ether (DBE), isobutanol, or a combination thereof, but is not limited thereto.

The solvent may be present in an amount of about 20 wt % to about 40 wt %, 20 wt % to about 30 wt %, or about 22 wt % to about 28 wt %, based on the total weight of the composition. Since the solvent has a high boiling point, volatilization of the solvent may be prevented, and compatibility may be secured. In addition, since phase separation of the solvent does not occur and milling properties are high, the solvent facilitates an ink manufacturing process. In addition, plate dryness and an increase in viscosity are small so that printing workability of the heat-resistant composition is excellent.

The heat-resistant composition according to the present invention may have a viscosity of about 10,000 centipoise (cps) or less, or about 8,000 cps or less, or about 6,000 cps or less, for example, about 3,000 cps to 6,000 cps, or about 3,000 cps to about 5,000 cps. When the viscosity of the high heat-resistant composition is less than 3,000 cps, flowability of the composition is high, and thus, the composition is difficult to control during a printing or coating process. When the viscosity exceeds 6,000 cps, the heat-resistant composition adheres to an outlet from which the heat-resistant composition flows and is not discharged in the printing or coating process, or does not spread on a surface of the substrate after the printing or coating process is performed, and thus is not suitable for the process.

A concentration of a solid content of the heat-resistant composition is not limited. However, in consideration of workability and the like, the solid content in the heat-resistant composition may be about 70 wt % to about 80 wt %, for example, about 72 wt % to about 78 wt %.

The heat-resistant composition according to an embodiment, may be used as an ink capable of being applied on a substrate to form a pattern.

The heat-resistant composition according to an exemplary embodiment, may be printed on a substrate so as to have a thickness of about 10 μm to about 20 μm, or about 12 μm to about 18 μm. The heat-resistant composition may be applied as a layer on one or both surfaces of the substrate. At least one layer of the heat-resistant composition may be applied to one or both surfaces.

The heat-resistant composition according to an embodiment, may be applied on the surface of the substrate through a printing or coating method. Specifically, the heat-resistant composition may be applied through a screen printing method, an inkjet printing method, a dot printing method, a dip coating method, a spray coating method, a spin coating method, a silk screen printing method, a roll-to-roll (R2R) coating method, a pressure casting method, or a slip casting method, but is not limited thereto. The terms "printing" and "coating" may be used interchangeably herein, and refer to the application of at least one layer on a surface and may refer to each other even when solely used. The layer may be substantially uniform and may be present on an entire surface or on only a portion of a surface.

The substrate may include at least one of glass, polycarbonate (PC), poly(methyl methacrylate) (PMMA), polyimide (PI), polypropylene (PP), polyethylene (PE), polyethylene terephthalate (PET), polystyrene (PS), or copolyester thermoplastic elastomer (COP). The substrate may have a thickness of about 50 μm or greater, or about 75 μm or greater or about 100 μm or greater, but is not limited thereto.

The heat-resistant composition according to an embodiment, may be cured by heating the heat-resistant composition at a temperature of about 150° C. or greater, or about 175° C. or greater or about 200° C. or greater, for example, about 160° C. to about 250° C., about 175° C. to about 230° C., and for example, about 190° C. to about 220° C. for about 15 minutes to about 5 hours, specifically, for about 30 minutes to about 2 hours, based on single tone printing. Alternatively, the heat-resistant composition may be printed on the substrate, and then the heat-resistant composition may be cured by heating the high heat-resistant composition during the process of three-dimensional (3D) thermoforming of the substrate.

To manufacture a 3D substrate on which a pattern is printed, a method has been used in which a planar substrate is first thermoformed into a desired 3D shape and then a pattern is printed on a surface of the 3D substrate using a non-heat resistant, pattern-forming ink. This is because when a pattern-forming ink is printed on a planar substrate and the substrate is then thermoformed at a high temperature of 600° C. or greater, due to insufficient heat resistance of the pattern-forming ink, a pigment is oxidized and discolored, or a printed layer is broken or detached during cleaning of the coated 3D shape with an alkaline solution.

Further, a method of printing a black pattern on such a 3D shape has continuously caused problems such as the occurrence of a printing tolerance and a printing defect according to an exposure process after printing due to the 3D shape and a large area thereof. As a result, there has been a demand for dimensional stability and exterior improvement in black pattern printing in a 3D substrate.

A method of manufacturing a 3D substrate including a pattern on a surface thereof (a 3D substrate on which a pattern is printed), according to an exemplary embodiment, comprises: applying the heat-resistant composition according to an exemplary embodiment on a planar substrate to form a surface-treated planar and three-dimensionally thermoforming the surface-treated planar substrate to provide the three-dimensional substrate. The heat-resistant composition according to an embodiment, may be applied in a pattern on the surface of the planar substrate.

FIG. 1 is a flowchart of the method of manufacturing the 3D substrate on which the pattern is printed according to an exemplary embodiment.

As shown in FIG. 1, prior to printing the heat-resistant composition according to the exemplary embodiment on a surface of the planar substrate to form the pattern, the method of manufacturing the 3D substrate including the pattern according to the exemplary embodiment may additionally include processing the planar substrate (S10) and performing a surface-treatment for anti-glare (AG)(S20).

The processing of the planar substrate (S10) means cutting and preparing a planar substrate having a predetermined dimension (size and shape) suitable for a product to which the planar substrate is to be applied.

The surface-treatment for the AG (S20) may be performed by applying an AG composition on a surface of the planar substrate through printing or coating methods, or by chemically or physically etching the surface.

In the method of manufacturing the 3D substrate on which the pattern is printed, after the surface-treatment for the AG (S20), the heat-resistant composition may be printed on the planar surface to form the pattern (S30). The 3D substrate on which the pattern is printed differs from a 3D substrate in which the planar substrate is first molded into a 3D shape and then an ink composition is applied to form a pattern, in that the heat-resistant composition is applied on the surface of the planar surface to form the pattern prior to the step of 3D thermoforming. Since the heat-resistant composition is applied on the planar substrate, it is possible to more easily perform the printing or coating process and ameliorate problems such as the occurrence of a printing tolerance and a printing defect, which are caused by directly applying an ink composition on a 3D substrate.

The method of manufacturing the 3D substrate on which the pattern is printed according to an embodiment, includes three-dimensionally thermoforming the planar substrate on which the high heat-resistant composition is applied (S40). The thermoforming is performed under a high temperature condition in which the substrate is deformable. For example, when the substrate is glass, the substrate may be thermoformed by heating the substrate at a temperature of about 600° C. to about 800° C. for about 15 minutes to about 5 hours, for example, about 30 minutes to about 2 hours. The heat-resistant composition may be cured concurrently through the thermoforming.

The three-dimensional thermoforming of the substrate may be performed through various methods. For example, the thermoforming may be performed by pressing and molding the planar substrate on which the heat-resistant composition is printed, between an upper mold and a lower mold and at a high temperature sufficient to deform the substrate from a planar surface to a desired curved surface, but is not limited thereto.

A protective layer made of a composition has previously been used on a substrate to be thermoformed, and prevents the printed layer from being discolored or damaged upon exposure to high temperature. However, since the heat-resistant composition according to the exemplary embodiment has ultrahigh heat resistance, a protective layer is not needed.

After completing the 3D thermoforming of the substrate, the method of manufacturing the 3D substrate on which the pattern is printed, according to an exemplary embodiment, may include strengthening the 3D thermoformed substrate (S50) and performing a surface-treatment which includes the application of an anti-fingerprint (AF) and/or anti-reflection (AR) coating (S60).

The strengthening of the substrate may be performed through heat strengthening or chemical strengthening, methods of which can be determined by those of skill in the art without undue experimentation.

The surface treatment for the AF and/or the AR may be performed by printing or coating a combined AF/AR composition on the surface of the substrate, or by separately coating an AF composition and an AR composition on the surface of the substrate.

According to the method of manufacturing the 3D substrate on which the pattern is printed according to an exemplary embodiment, a pattern may be formed on a display of an electronic device such as a mobile phone, a digital camera, and a navigation device, and on a peripheral portion of a front glass of a vehicle, but is not limited thereto.

Figure 2:
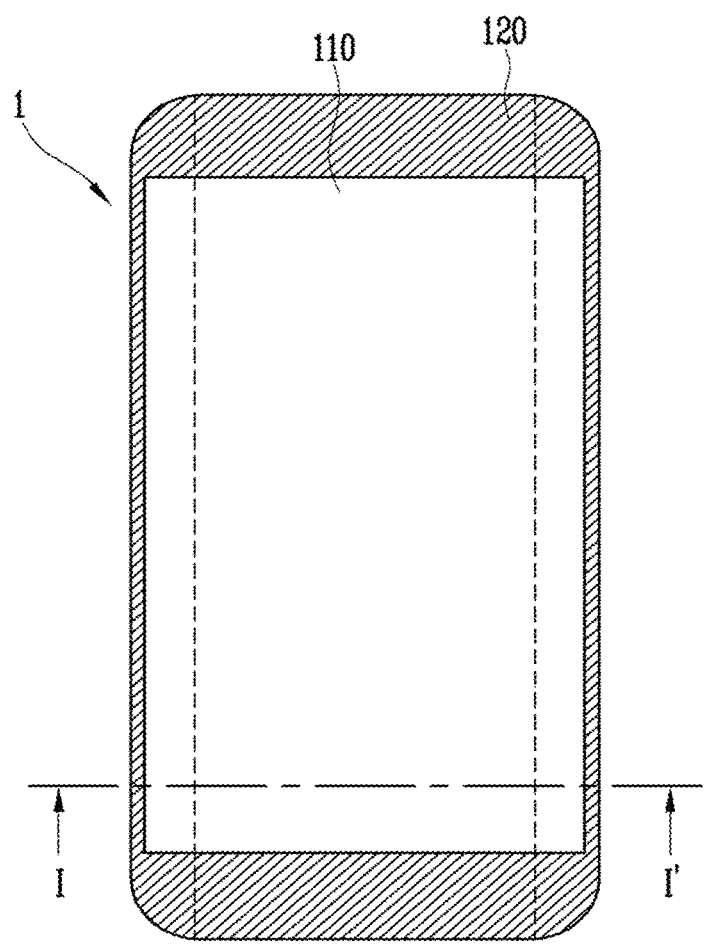
FIG. 2 is a top plan view illustrating a 3D substrate on which a pattern is printed using a heat-resistant composition according to an exemplary embodiment.

FIG. 2 is a plan view illustrating a 3D substrate on which a pattern is printed using a heat-resistant composition according to an exemplary embodiment.

Referring to FIG. 2, it is possible to confirm a plan view of a substrate 1 on which a pattern is formed, which is manufactured through the method of manufacturing the 3D substrate on which the pattern is printed according to an exemplary embodiment. The substrate 1 on which the pattern is formed includes a pattern layer 120 printed on a 3D substrate 110.

Figure 3:
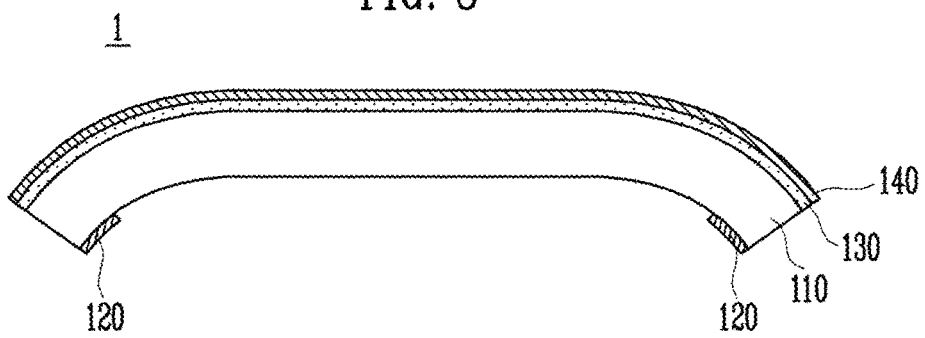
FIG. 3 is a cross-sectional view taken along line I-I' of FIG. 2, and shows the substrate on which the pattern is formed, according to an exemplary embodiment.
Figure 4A:
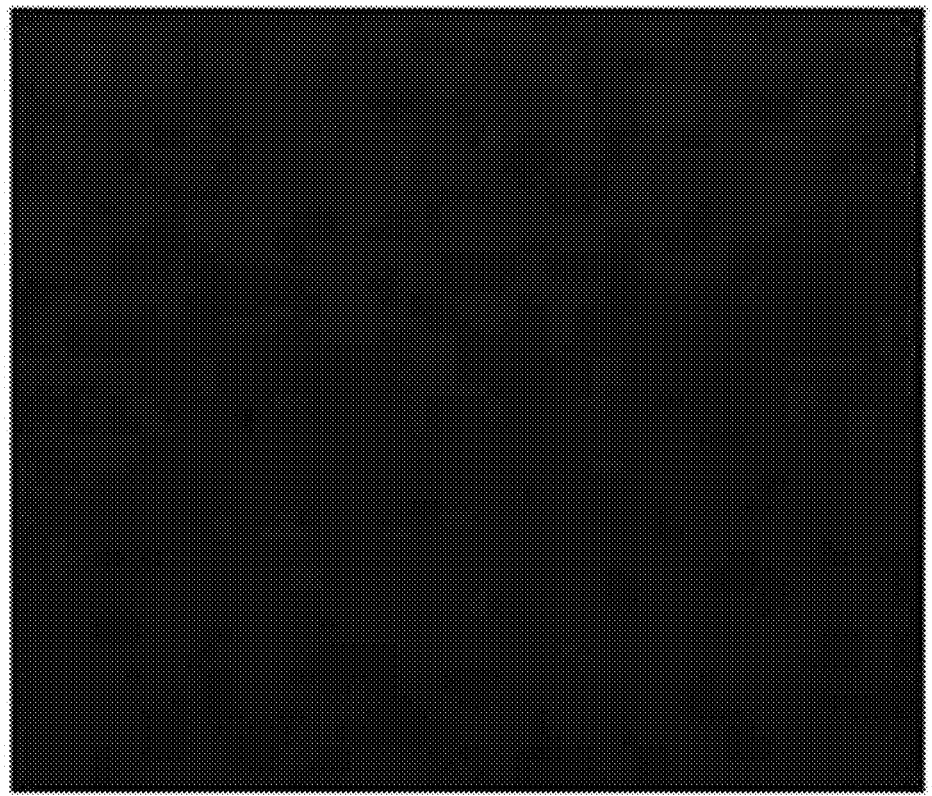
FIGS. 4A to 4H are images of printed layers applied on a glass substrate and prepared in accordance with Example 11 (FIGS. 4A-4D) and Comparative Example 1 (FIGS. 4E to 4H), and which show the state of the printed layers after drying (FIGS. 4A, 4E), the state of the printed layers after immersion in hot water (FIGS. 4B, 4F), the state of the printed layers after alkaline cleaning (FIGS. 4C, 4G), and the state of the printed layers after chemical strengthening (FIGS. 4D, 4H).
Figure 4B:
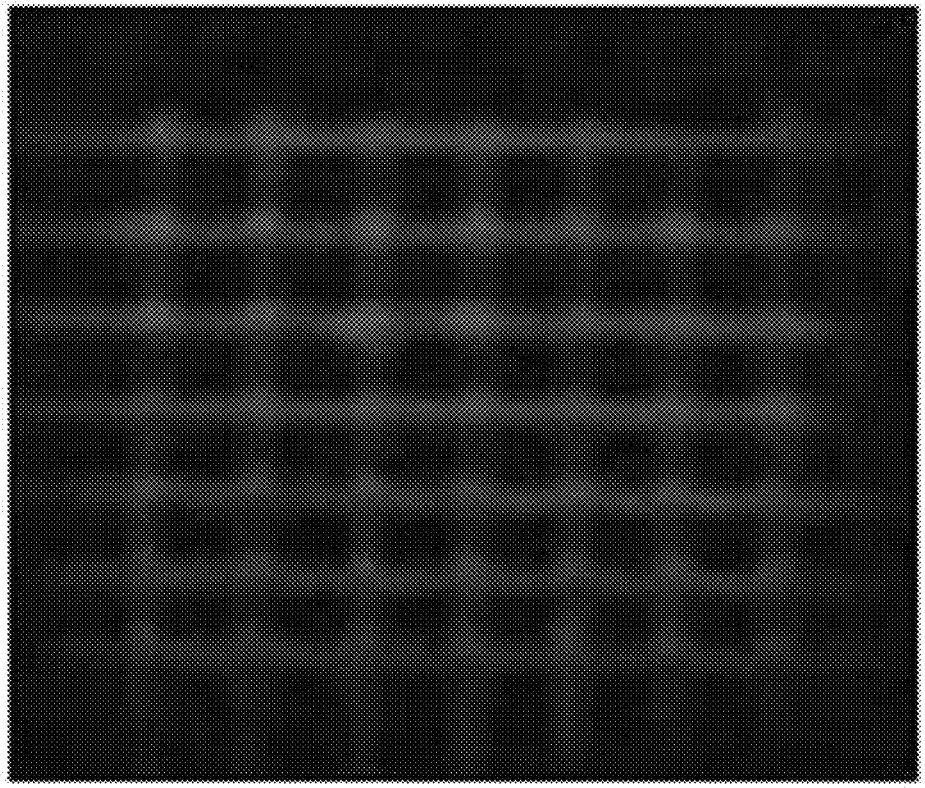
Figure 4C:
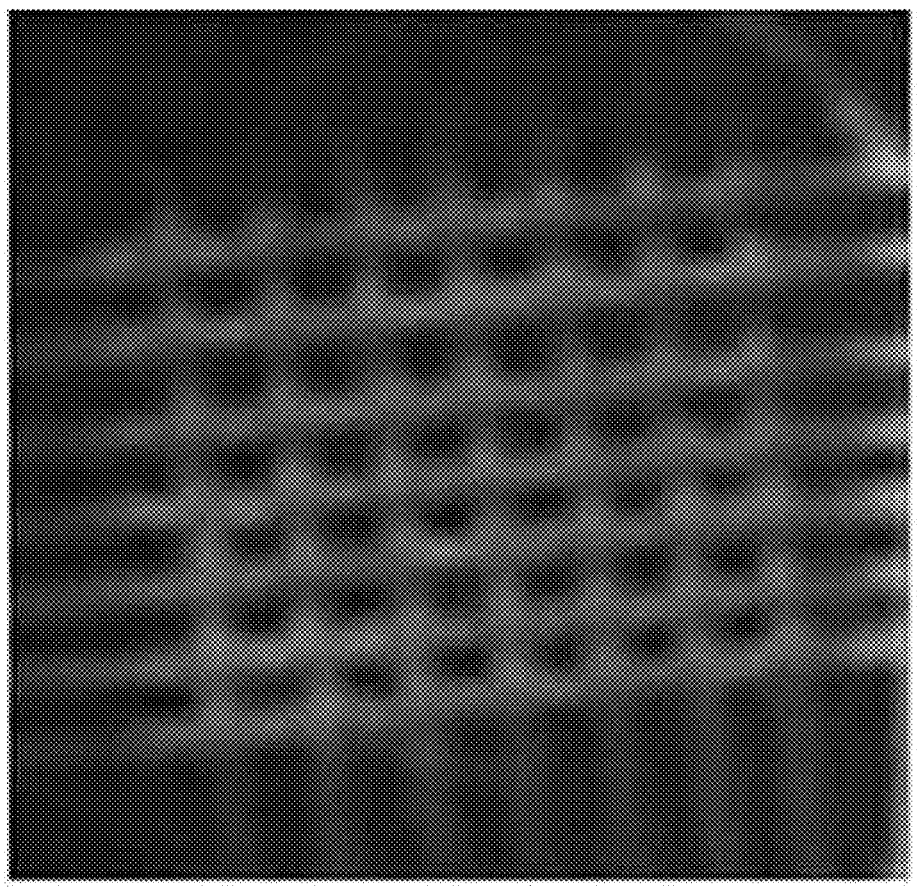
Figure 4D:
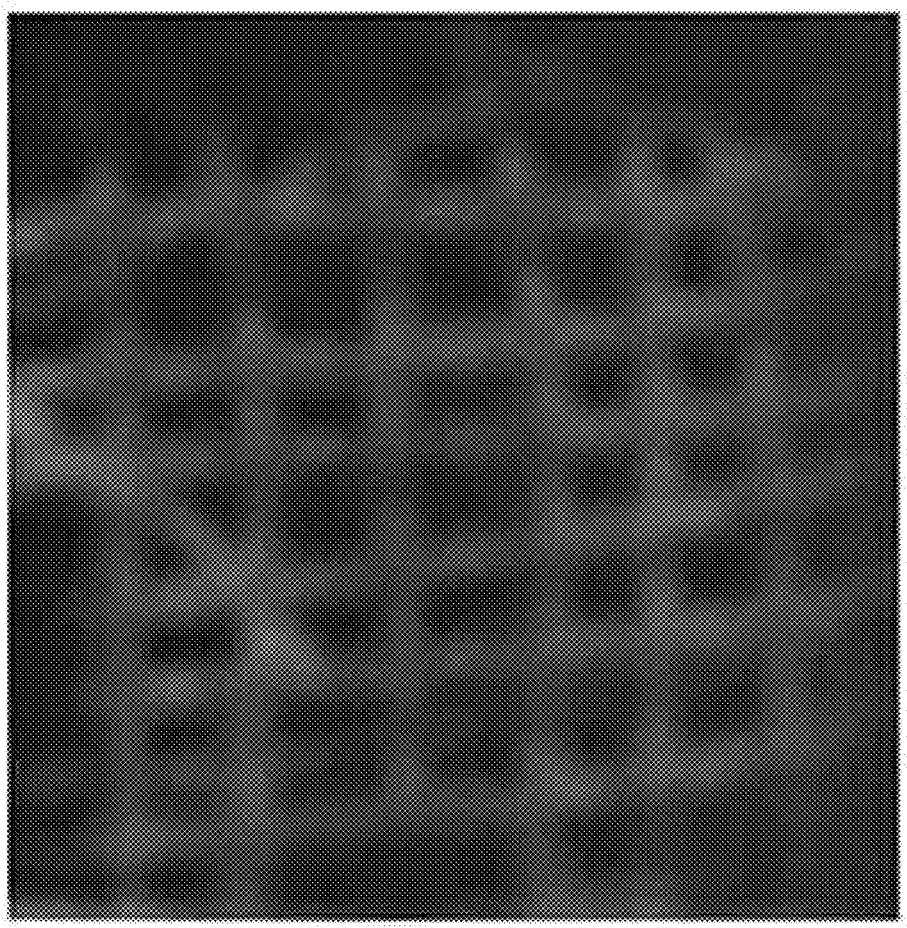
Figure 4E:
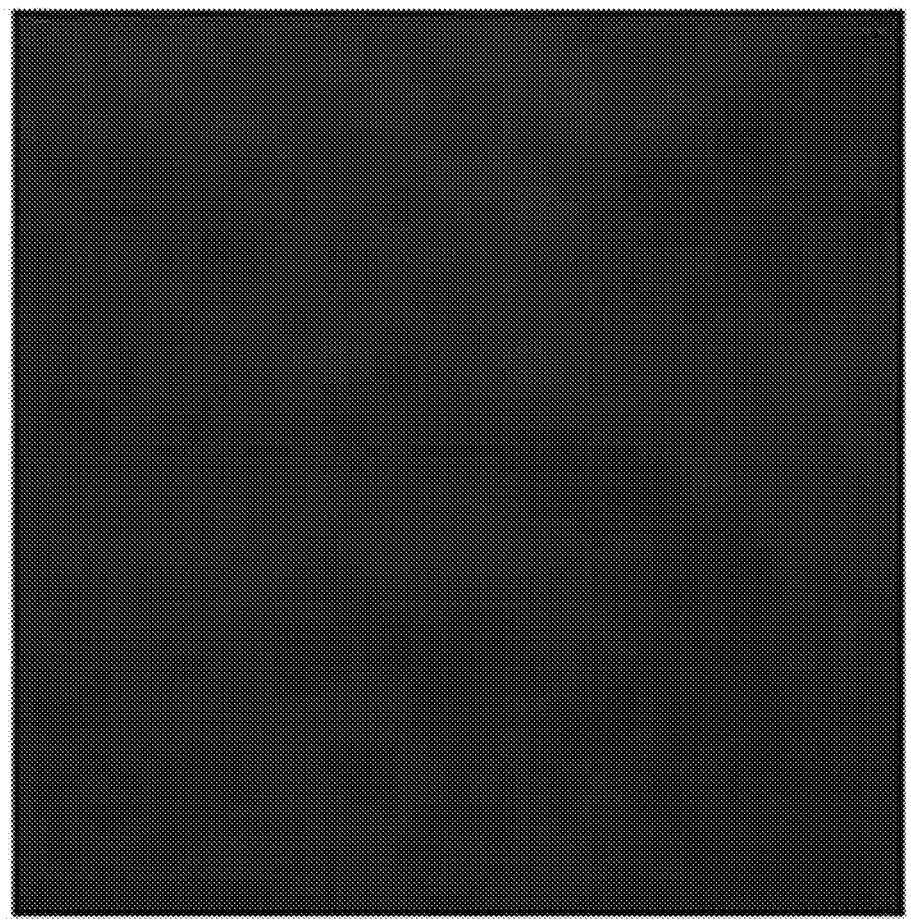
Figure 4F:
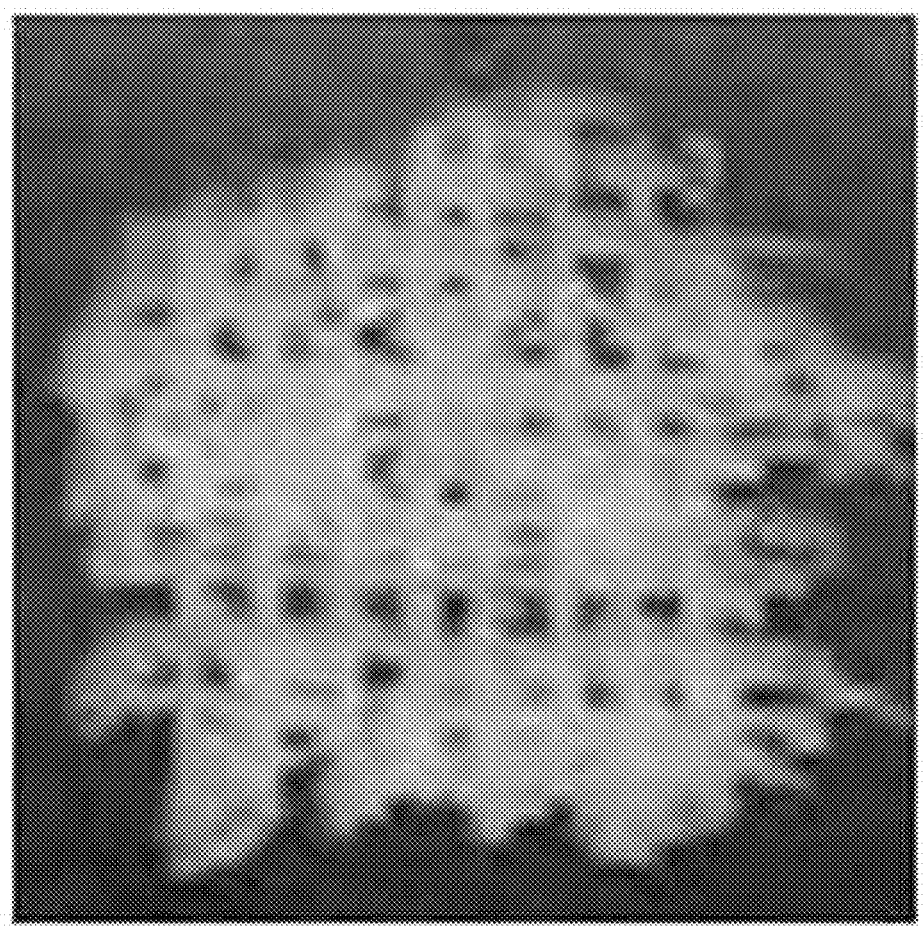
Figure 4G:
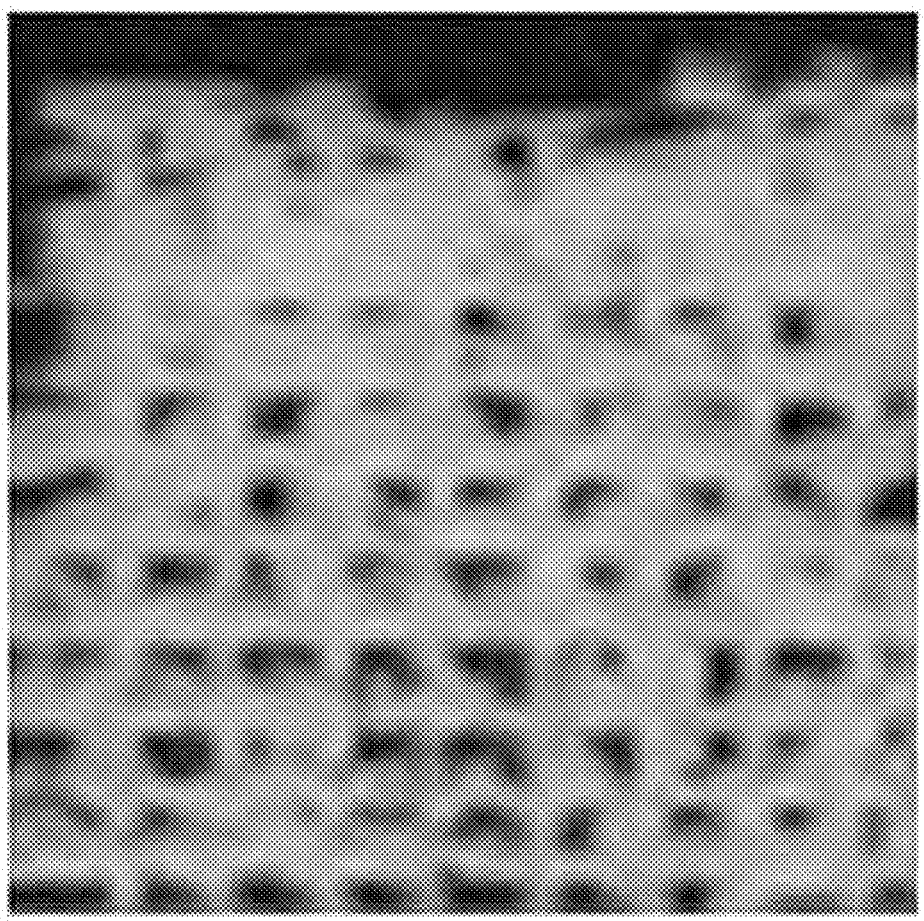
Figure 4H:
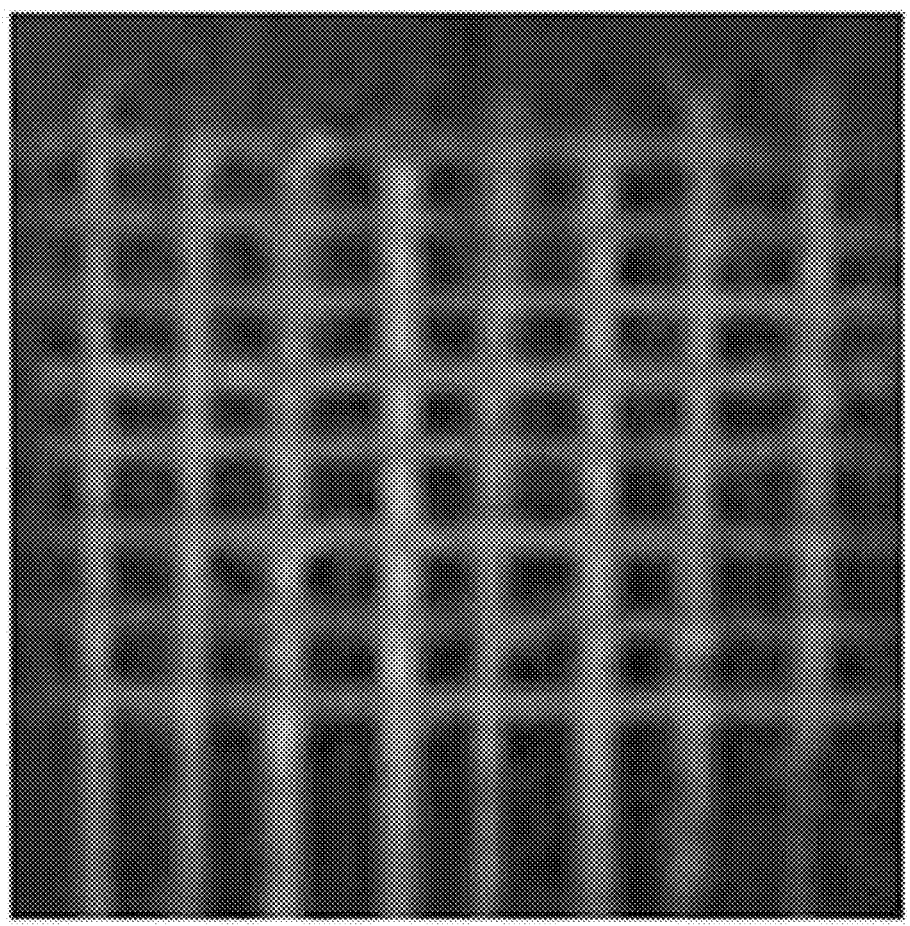

FIG. 3 is a cross-sectional view taken along line I-I' of FIG. 2 of the substrate 1 on which the pattern is formed.

Referring to FIG. 3, in the substrate 1 on which the pattern is formed, the pattern layer 120 is stacked on a surface of the substrate 110 and includes the heat-resistant composition, and an AG layer 130 and an AF/AR layer 140 are sequentially stacked on a surface of the substrate 110 opposite the pattern layer 120.

EXAMPLES

Example 1: Preparation of Heat-Resistant Ink Compositions

Various heat-resistant compositions were prepared by combining compounds, and have the compositions shown in Tables 1 and 2 below.

TABLE 1

| | | Example | | | | | |
| --- | --- | --- | --- | --- | --- | --- | --- |
| | | 1 | 2 | 3 | 4 | 5 | 6 |
| Binder resin | Silicone-modified polyester resin | 7.0 | 10.5 | 10.5 | 14.0 | 14.0 | 17.5 |
| | Polysiloxane | 28.0 | 24.5 | 24.5 | 21.0 | 21.0 | 17.5 |
| | Trimethylsilanol | 0 | 0 | 0 | 0 | 0 | 0 |
| Pigment | ICCB | 31.5 | 31.5 | 0 | 31.5 | 0 | 0 |
| | CCB | 0 | 0 | 0 | 0 | 0 | 0 |
| | ICM | 0 | 0 | 31.5 | 0 | 31.5 | 31.5 |
| | Carbon black | 3.5 | 3.5 | 3.5 | 3.5 | 3.5 | 3.5 |
| Low activity catalyst | Tetra-isopropoxy titanate | 2.0 | 2.0 | 2.0 | 2.0 | 2.0 | 2.0 |
| Solvent | BCS | 28.0 | 28.0 | 28.0 | 28.0 | 28.0 | 28.0 |
| Total weight ratio | | 100 | 100 | 100 | 100 | 100 | 100 |

TABLE 2

| | | Example | | | | | |
| --- | --- | --- | --- | --- | --- | --- | --- |
| | | 7 | 8 | 9 | 10 | 11 | 12 |
| Binder resin | Silicone-modified polyester resin | 10.5 | 10.5 | 10.5 | 10.5 | 10.5 | 10.5 |
| | Polysiloxane | 17.5 | 17.5 | 17.5 | 17.5 | 17.5 | 10.5 |
| | Trimethylsilanol | 7.0 | 7.0 | 7.0 | 7.0 | 7.0 | 14.0 |
| Pigment | ICCB | 0 | 0 | 31.5 | 28.0 | 24.5 | 0 |
| | CCB | 0 | 0 | 0 | 0 | 0 | 0 |
| | ICM | 31.5 | 29.8 | 0 | 0 | 0 | 31.5 |
| | Carbon black | 3.5 | 5.2 | 3.5 | 7.0 | 10.5 | 3.5 |
| Low activity catalyst | Tetra-isopropoxy titanate | 2.0 | 2.0 | 2.0 | 2.0 | 2.0 | 2.0 |
| Solvent | BCS | 28.0 | 28.0 | 28.0 | 28.0 | 28.0 | 28.0 |
| Total weight ratio | | 100 | 100 | 100 | 100 | 100 | 100 |

Comparative Example 1: Preparation of Comparative Ink Compositions

Ink compositions to be compared with the above-described heat-resistant compositions of the Examples, were prepared by mixing compounds having compositions shown in Table 3 below.

TABLE 3

| | | Comparative Example | | | | | |
|---|---|---|---|---|---|---|---|
| | | 1 | 2 | 3 | 4 | 5 | 6 |
| Binder resin | Silicone-modified polyester resin | 35.0 | 0 | 10.5 | 10.5 | 10.5 | 10.5 |
| | Polysiloxane | 0 | 35.0 | 17.5 | 17.5 | 17.5 | 17.5 |
| | Trimethylsilanol | 0 | 0 | 7.0 | 7.0 | 7.0 | 7.0 |
| Pigment | ICCB | 31.5 | 31.5 | 35.0 | 0 | 0 | 0 |
| | CCB | 0 | 0 | 0 | 35.0 | 0 | 0 |
| | ICM | 0 | 0 | 0 | 0 | 35.0 | 0 |
| | Carbon black | 3.5 | 3.5 | 0 | 0 | 0 | 35.0 |
| Low activity catalyst | Tetra-isopropoxy titanate | 2 | 2 | 2 | 2 | 2 | 2 |
| Solvent | BCS | 28.0 | 28.0 | 28.0 | 28.0 | 28.0 | 28.0 |
| Total weight ratio | | 100 | 100 | 100 | 100 | 100 | 100 |

Experimental Example 1: Evaluation of Properties

In order to confirm physicochemical properties of the compositions prepared in Examples 1 to 12 and Comparative Examples 1 to 6, the following experiments were performed.

1.1: Viscosity Measurement

Viscosity of the compositions prepared in Examples 1 to 12 and Comparative Examples 1 to 6 were measured.

As a result of the experiments, the viscosity of Examples 1 to 12 and Comparative Examples 1 to 6 were confirmed to be in a range of 3,000 cps to 5,800 cps, and thus, Examples 1 to 12 and Comparative Examples 1 to 6 appeared to be suitable for use in a printing or coating process (see Tables 4 to 6 below).

1.2: Confirmation of Properties of Printed Layer Applied on Substrate

In order to confirm properties of the compositions prepared in Examples 1 to 12 and Comparative Examples 1 to 6, the compositions were applied on a glass substrate. Specifically, each composition was printed on a 1 mm-thick planar glass substrate so as to have a thickness of 5.0 μm, and then, the glass substrate was dried.

Optical density of a printed layer on a portion of the dried glass substrate was measured using an absorbance meter. Immediately after the printing, a surface of the printed layer of the dried glass substrate was cross-cut with a knife, and then, the dried glass substrate was immersed in hot water at a temperature of 100° C. for 20 minutes. In order to confirm an adhesive force of each printed layer, a tape was attached to a surface of the cut printed layer and then removed. The adhesion was qualitatively assessed based on a relative scale ranging from 1 B to 5 B, with 5 B corresponding to no removal of the cut printed layer and 1 B corresponding to removal of 80-100% of the cut printed layer to which the tape is attached. Then, the darkness of each printed layer was visually evaluated based on a scale in which X means no discoloration and O means discoloration is present.

In order to evaluate adhesion (e.g., detergency) of the printed layer to the substrate, the dried glass substrate was cleaned with a KOH aqueous solution (with pH 13) at a temperature of 65° C. for 15 minutes, and then a tape was attached to the surface of the cut printed layer and removed to visually evaluate peeling-off and an adherence force of the printed layer.

In order to evaluate discoloration of the printed layer on the dried glass substrate after chemical strengthening, the dried glass substrate was immersed in a 420° C. $KNO_3$ aqueous solution for 5 hours, and then a tape was attached to the surface of the cut printed layer and removed to visually evaluate an adhesive force of the printed layer.

The compositions of Examples 1 to 12 exhibited excellent effects in each of the printing property evaluation, the cleaning evaluation, and the strengthening evaluation (see Tables 4 and 5 below). Specifically, since the composition of Example 11 had excellent thermal stability and alkali resistance, it could be confirmed that after the tape was peeled off, a clear cross-cut shape was observed on a surface of the printed layer, both after the printed layer was immersed in hot water and after the printed layer was cleaned with an alkali (see Example 11 of FIGS. 4A to 4D).

However, in the case of Comparative Examples 1 and 2 only using a single binder, since the thermal stability was lower, an adhesive force after a heat treatment and an adhesive force in hot water appeared to be very low (see Table 6 below). Specifically, since the composition of Comparative Example 1 had low thermal stability and alkali resistance, it could be confirmed that the printed layer was peeled off to such an extent that a cross-cut shape could not be confirmed on a surface of the printed layer, either after the printed layer was immersed in hot water or after the printed layer was cleaned with an alkali (see Comparative Example 1 of FIGS. 4E to 4H).

In addition, among Comparative Examples 3 to 6 only using a single pigment, in the case of Comparative Examples 3 to 5, it was confirmed that a printed layer was almost entirely peeled off during the adhesion force evaluation test after alkaline cleaning. In addition, in the case of Comparative Example 6, since thermal stability was lowered, an adhesive force after a heat treatment and an adhesive force in hot water appeared to be very low (see Table 6 below).

TABLE 4

| | | Example | | | | | |
|---|---|---|---|---|---|---|---|
| | | 1 | 2 | 3 | 4 | 5 | 6 |
| | Viscosity (cps) | 5,600 | 5,400 | 5,000 | 4,000 | 4,200 | 3,500 |
| Printing property evaluation | O/D | 1.5 | 1.7 | 3.0-3.2 | 3.1 | 3.1 | 2.7-3.0 |
| | Adhesive force (after printing) | 5B | 5B | 5B | 5B | 5B | 5B |
| | Adhesive force (hot water) | 5B | 5B | 5B | 5B | 5B | 5B |

TABLE 4-continued

|  |  | Example | | | | | |
|---|---|---|---|---|---|---|---|
|  |  | 1 | 2 | 3 | 4 | 5 | 6 |
| Cleaning evaluation | Peeling-off | X | X | X | X | X | X |
|  | Adhesive force | 4B | 4B | 4B | 5B | 5B | 5B |
| Chemical strengthening evaluation | Discoloration | X | X | X | X | X | X |

X = none;
○ = present;
O/D is optical density.

TABLE 5

|  |  | Example | | | | | |
|---|---|---|---|---|---|---|---|
|  |  | 7 | 8 | 9 | 10 | 11 | 12 |
|  | Viscosity (cps) | 4,200 | 4,500 | 4,100 | 3,200 | 3,000 | 3,600 |
| Printing property evaluation | O/D | 3.9-4.2 | 3.8-4.2 | 2.2 | 3.3 | 4.3 | 4.3 |
|  | Adhesive force (after printing) | 5B | 5B | 5B | 5B | 5B | 5B |
|  | Adhesive force (hot water) | 5B | 3B | 5B | 5B | 5B | 5B |
| Cleaning evaluation | Peeling-off | X | X | X | X | X | X |
|  | Adhesive force | 5B | 5B | 5B | 5B | 5B | 2B |
| Chemical strengthening evaluation | Discoloration | X | X | X | X | X | X |

TABLE 6

|  |  | Comparative Example | | | | | |
|---|---|---|---|---|---|---|---|
|  |  | 1 | 2 | 3 | 4 | 5 | 6 |
|  | Viscosity (cps) | 5,800 | 4,500 | 3,800 | 4,000 | 4,300 | 4,400 |
| Printing property evaluation | O/D | 4.1-4.3 | 4.0 | 3.8 | 3.2 | 3.5 | 2.0 |
|  | Adhesive force (after printing) | 5B | 1B | 5B | 5B | 5B | 5B |
|  | Adhesive force (hot water) | 0B | 0B | 4B | 4B | 3B | 0B |
| Cleaning evaluation | Peeling-off | X | ○ | X | X | X | X |
|  | Adhesive force | 0B | 0B | 1B | 1B | 1B | 3B |
| Chemical strengthening evaluation | Discoloration | ○ | ○ | X | ○ | X | ○ |

A heat-resistant composition according to exemplary embodiments exhibits ultrahigh heat resistance so as to not be decomposed even when subjected to a heat treatment at an ultrahigh temperature of 800° C. When a chemical strengthening process is performed on a glass substrate, there is no strengthening deviation between a region of the glass substrate printed with the high heat-resistant composition and a region of the glass substrate not printed with the heat-resistant composition. In addition, even during a chemical strengthening process and/or a cleaning process using a strong base solution, the high heat-resistant composition exhibits excellent ease of chemical strengthening and ease of cleaning such that a printed layer is not detached, cracked, and/or discolored.

Due to the ultrahigh heat resistance, the ease of chemical strengthening, and the ease of cleaning, a planar substrate may be coated using the heat-resistant composition and then may be subjected to a three-dimensional thermoforming process. Therefore, exemplary embodiments provide a process of manufacturing a 3D substrate, in which a printing tolerance and exterior defects of a printed substrate are ameliorated to improve yield, and the difficulty of a manufacturing process is reduced to thereby decrease total manufacturing cost.

Although exemplary embodiments have been referenced and described above, it will be understood that it is possible for those of ordinary skill in the art to implement modifications and variations on the present invention without departing from the concept and scope listed in the following appended claims.

Therefore, the technical scope should not be limited to the contents described in the detailed description of the specification, but should be defined by the claims.

What is claimed is:
1. A heat-resistant composition comprising:
   a binder resin comprising at least two of: of a silicone-modified polyester resin, a siloxane compound, or a silanol compound;
   a pigment; and
   a catalyst;

wherein the pigment consists of a mixture of one of iron cobalt chromite black spinel, copper chromite black spinel or iron chromite manganese, and carbon black in a weight ratio of 1:1 to 9:1, or wherein the pigment includes a mixture of iron cobalt chromite black spinel and iron chromite manganese in a weight ratio of 1:1 to 9:1.

2. The heat-resistant composition of claim 1, wherein the siloxane compound is represented by Formula 1:

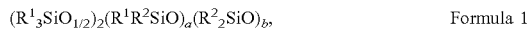

Formula 1 wherein, $R^1$ is a hydrogen atom, a $C_1$-$C_{10}$ alkyl group, a $C_2$-$C_6$ alkenyl group, a $C_6$-$C_{12}$ aryl group, or a $C_1$-$C_6$ alkoxy group, $R^2$ is a hydrogen atom, a $C_1$-$C_{10}$ alkyl group, or a $C_6$-$C_{12}$ aryl group, a and b are each independently 0 or an integer of 1 to 10,000, and a+b is 5 to 10,000.

3. The heat-resistant composition of claim 1, wherein the silanol compound includes at least one of trimethylsilanol or dimethylsilanol.

4. The heat-resistant composition of claim 1, wherein the binder resin comprises a mixture of the silicone-modified polyester resin and the siloxane compound in a weight ratio of 1:1 to 1:9.

5. The heat-resistant composition of claim 1, wherein the binder resin comprises a mixture of the silicone-modified polyester resin, the siloxane compound, and the silanol compound in a weight ratio of 1:1-5:0.1-3.

6. The heat-resistant composition of claim 1, wherein the catalyst comprises a chelated titanate compound, and wherein the catalyst is present in an amount of about 1 weight percent to about 3 weight percent, based on the total weight of the composition.

7. The heat-resistant composition of claim 1, further comprising a substrate, and wherein the composition is printed on the substrate in a thickness of about 10 micrometers to about 20 micrometers, and wherein the substrate comprises glass, polycarbonate, poly(methyl methacrylate), polyimide, polypropylene, polyethylene, polyethylene terephthalate, polystyrene, a copolyester thermoplastic elastomer, or a combination thereof.

8. A method of manufacturing a three-dimensional substrate comprising a pattern on a surface thereof, the method comprising:

applying the heat-resistant composition of claim 1 on a surface of a planar substrate to form a surface-treated planar substrate; and three-dimensionally thermoforming the surface-treated planar substrate to provide the three-dimensional substrate.

* * * * *